(12) United States Patent
Jang

(10) Patent No.: US 9,111,777 B2
(45) Date of Patent: Aug. 18, 2015

(54) LIGHT EMITTING DEVICE AND LIGHT UNIT USING THE SAME

(75) Inventor: Kee Youn Jang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 429 days.

(21) Appl. No.: 12/882,853

(22) Filed: Sep. 15, 2010

(65) Prior Publication Data

US 2011/0149601 A1    Jun. 23, 2011

(30) Foreign Application Priority Data

Dec. 21, 2009   (KR) .................. 10-2009-0128529

(51) Int. Cl.
*H01L 33/48* (2010.01)
*H01L 25/075* (2006.01)

(52) U.S. Cl.
CPC ............ *H01L 25/0753* (2013.01); *H01L 33/483* (2013.01); *H01L 2924/0002* (2013.01)

(58) Field of Classification Search
CPC ............ H01L 2924/00; H01L 25/0753; H01L 33/483
USPC .................. 362/612, 613, 632, 633, 634, 511
See application file for complete search history.

(56) References Cited

U.S. PATENT DOCUMENTS

| 6,682,211 B2 * | 1/2004 | English et al. ................. 362/545 |
| 6,991,355 B1 * | 1/2006 | Coushaine et al. ............ 362/555 |
| 7,758,211 B2 * | 7/2010 | Zheng et al. ............. 362/249.02 |

| 2007/0195524 A1 | 8/2007 | Seo et al. |
| 2007/0246714 A1 | 10/2007 | Koike et al. |
| 2007/0262328 A1 | 11/2007 | Bando |
| 2009/0135599 A1 | 5/2009 | Lin et al. |
| 2010/0295089 A1 | 11/2010 | Kim et al. |

FOREIGN PATENT DOCUMENTS

| JP | 2006-093359 A | 4/2006 |
| JP | 2006-287032 A | 10/2006 |
| JP | 2000-91647 | 3/2007 |
| JP | 2007-227373 A | 9/2007 |
| JP | 2007227679 A | 9/2007 |
| JP | 2008-98218 A | 4/2008 |
| JP | 2008-108942 | 5/2008 |
| JP | 2008-130909 | 6/2008 |
| JP | 2009-004443 A | 1/2009 |
| JP | 2009-135080 A | 6/2009 |
| JP | 2009177101 A | 8/2009 |
| KR | 10-2009-99785 | 9/2009 |
| KR | 10-2011-0001079 A | 1/2011 |
| TW | 200834178 A | 8/2008 |
| TW | M355346 | 4/2009 |
| TW | 200924183 A | 6/2009 |
| WO | 2009/057983 A2 | 5/2009 |

* cited by examiner

*Primary Examiner* — Sharon Payne
(74) *Attorney, Agent, or Firm* — Dentons US LLP

(57) ABSTRACT

Provided is a light emitting device and light unit using the same. The light emitting device comprises: a body that includes a horizontal surface; an electrode at least partially disposed in the body; two or more mounting parts protruding from the horizontal surface, wherein the two or more mounting parts are separated from each other by a space, and wherein each of the at least two or more mounting parts includes a surface that is inclined relative to the horizontal surface; and two or more light emitting diodes, each mounted on the inclined surface of a corresponding one of the two or more mounting parts and electrically connected to the electrode.

27 Claims, 11 Drawing Sheets

LIGHT EMITTING DEVICE AND LIGHT UNIT USING THE SAME

CROSS-REFERENCE TO RELATED APPLICATIONS

The present application claims priority under 35 U.S.C. §119 to Korean Patent Application No. 10-2009-0128529 filed on Dec. 21, 2009, which is hereby incorporated by reference in its entirety.

BACKGROUND

A light emitting diode (LED) a semiconductor light emitting device converting current to light. In recent years, an LED can be implemented a light emitting device emitting white light having superior efficiency by using fluorescent material or by combining individual LEDs that emit three primary colors.

Also, since the luminance of the light emitting device using an LED increases gradually, the light emitting device is being used as a light source in various fields, such as a backlight for displays, a lighting display, an image display, etc.

SUMMARY

Embodiments provide a light emitting device that allows an orientation angle to be adjusted inside a package, has superior light efficiency, and can guarantee heat radiation performance.

Embodiments also provide a light unit that has superior light efficiency and can decrease the number of light emitting devices.

In one embodiment, a light emitting device comprises: a body that includes a horizontal surface; an electrode at least partially disposed in the body; two or more mounting parts protruding from the horizontal surface, wherein the two or more mounting parts are separated from each other by a space, and wherein each of the at least two or more mounting parts includes a surface that is inclined relative to the horizontal surface; and two or more light emitting diodes, each mounted on the inclined surface of a corresponding one of the two or more mounting parts and electrically connected to the electrode.

In another embodiment, a light emitting device comprises: a semiconductor body including a first surface; an insulating layer over at least a portion of the first surface; an electrode over at least a portion of the insulating layer; a mounting part projecting from the insulating layer, the mounting part including a second surface that is inclined relative to the first surface; and a light emitting diode mounted on the second surface and electrically connected to the electrode.

In a further embodiment, a light unit comprises: a light guide panel; and one or more light emitting devices providing light to the light guide panel, wherein each of the one or more light emitting devices comprises: a body that includes a horizontal surface; an electrode at least partially disposed in the body; two or more mounting parts protruding from the horizontal surface, wherein the two or more mounting parts are separated from each other by a space, and wherein each of the at least two or more mounting parts includes a surface that is inclined relative to the horizontal surface; and two or more light emitting diodes, each mounted on the inclined surface of a corresponding one of the two or more mounting parts and electrically connected to the electrode.

In still another embodiment, a light unit comprises: a light guide panel; and one or more light emitting devices providing light to the light guide panel, wherein each of the one or more light emitting devices comprises: a semiconductor body including a first surface; an insulating layer over at least a portion of the first surface; an electrode over at least a portion of the insulating layer; a mounting part projecting from the insulating layer, the mounting part including a second surface that is inclined relative to the first surface; and a light emitting diode mounted on the second surface and electrically connected to the electrode.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are shown in the accompanying drawings. In the following description, it will be understood that when a layer (or film) is referred to as being "on" another layer or substrate, it can be directly on the other layer or substrate, or intervening layers may also be present. Further, it will be understood that when a layer is referred to as being "under" another layer, it can be directly under the other layer, and one or more intervening layers may also be present. In addition, it will also be understood that when a layer is referred to as being "between" two layers, it can be the only layer between the two layers, or one or more intervening layers may also be present. In the figures, the dimensions of layers and regions are exaggerated for clarity of illustration. In addition, the dimension of each part does not reflect an actual size.

Figure 1:
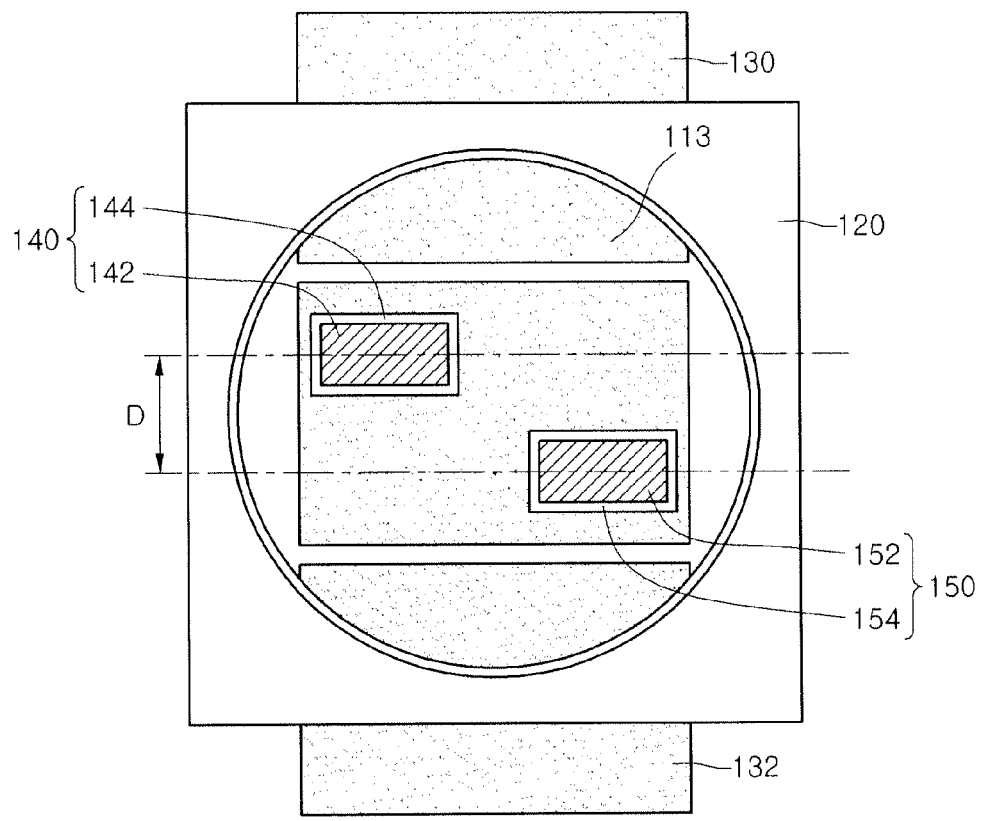
FIG. 1 is a plane view of a light emitting device according to a first embodiment.
Figure 2:
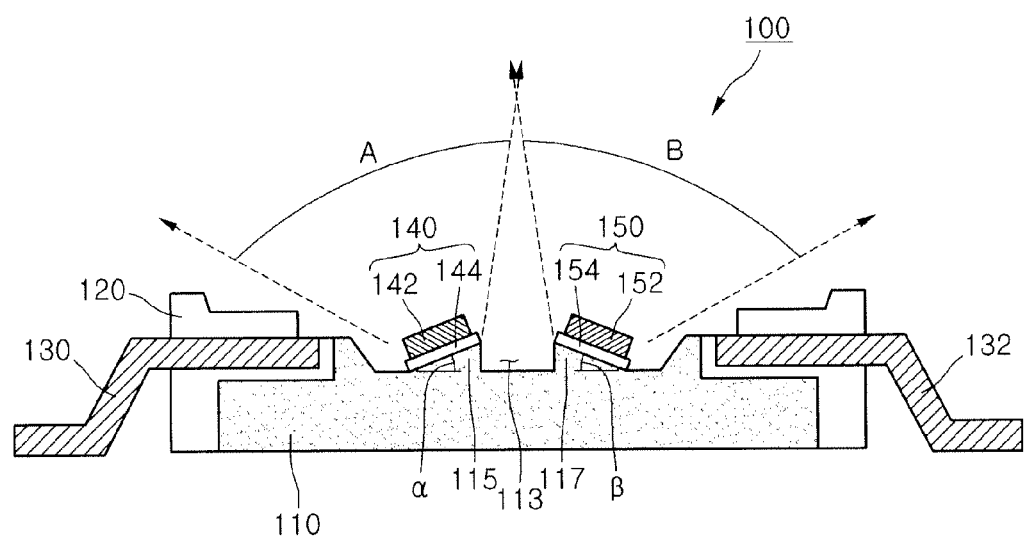
FIG. 2 is a cross-sectional view of a light emitting device according to the first embodiment.
Figure 3:
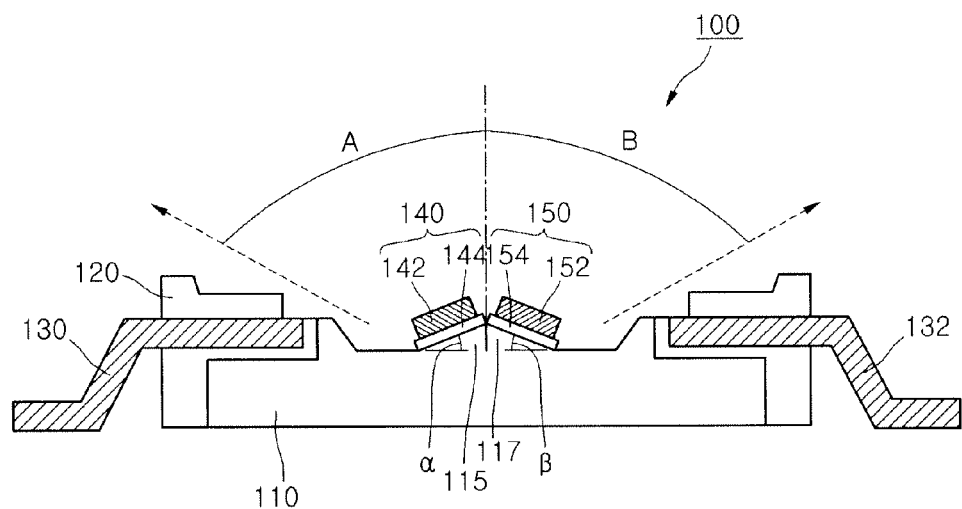
FIG. 3 is a cross-sectional view of a light emitting device according to a second embodiment.

FIG. 1 is a plane view of a light emitting device according to a first embodiment, FIG. 2 is a cross-sectional view of a light emitting device according to the first embodiment, and FIG. 3 is a cross-sectional view of a light emitting device according to a second embodiment and exemplarily shows that the current embodiment is applied to a lead frame package type light emitting device.

As shown in FIGS. 1 and 2, a light emitting device 100 according to the first embodiment includes a body 120 having a cavity 113, a first electrode 130 and a second electrode 132 disposed in the body 120, and a heat radiation member 110 having inclination surfaces for mounting a plurality of light emitting diodes 140, 150 in the cavity 113 and thermally connected to the light emitting diodes 140, 150. The heat radiation member is formed within and exposed through an opening in the body.

Herein, the cavity 113 in which the light emitting device 100 is mounted may be sealed by using a sealant (not shown).

The cavity 113 in which the light emitting diodes 140, 150 are mounted may be formed at an upper portion of the body 120. The body 120 may be formed of various materials such as ceramic, silicon, resin, etc. The body 120 may be formed in a single body structure using an injection molding, or in a multi-layered structure.

The cavity 113 may be formed in a concave container shape, such as a cup shape, a polygonal shape, an elliptical shape, a circular shape, etc. Herein, a circumferential surface of the cavity 113 may be formed vertically or with a predetermined slope in consideration of distribution angles of the mounted light emitting diodes 140, 150. A surface of the cavity 113 may be coated or deposited with a high reflectivity material, for example, white photo solder resist (PSR) ink, silver (Ag), aluminum (Al) or the like, so that the luminous efficiency of the light emitting device 100 can be enhanced.

One terminals of the first and second electrodes 130 and 132 may be electrically connected to the light emitting diodes 140 and 150, respectively, and the other terminals may be electrically connected to a substrate (not shown) on which the light emitting device 100 is mounted, to supply power to the light emitting diodes 140 and 150. Therefore, the first and second electrodes 130 and 132 may be formed such that one terminals are disposed inside the body 120 on which the light emitting diodes 140 and 150 are mounted, and the other terminals are exposed to an outer lower side of the body 120. While the present embodiment exemplarily shows and describes that two electrodes 130 and 132 are formed, it is to be understood that two or more electrodes may be formed according to the number of the light emitting diodes. Also, the first and second electrodes 130 and 132 may be modified in various shapes, such as a shape enclosing the body 120 or in a shape the other terminals of which are branched. The light emitting diodes 140 and 150 may be provided in a structure in which light emitting chips 142 and 152 are formed on dies 144 and 154, respectively. Each of the light emitting diodes 140 and 150 may be at least one of a red light emitting diode emitting red light, a green light emitting diode emitting green light, and a blue light emitting diode emitting blue light, and is not limited thereto. In this embodiment, since the light emitting diodes 140, 150 are two or more, it is also possible to apply the light emitting diodes 140, 150 each emitting a different color light.

The heat shielding member 110 is formed of material such as metal, resin or the like having a good thermal conductivity, and is thermally connected to the light emitting diodes 140, 150. At an upper portion of the heat shielding member 110, a first mounting part 115 having an inclination surface on which the first light emitting diode 140 is mounted, and a second mounting part 117 having an inclination surface on which the second light emitting diode 150 is mounted, may be formed.

As shown in FIG. 1, the first mounting part 115 and the second mounting part 117 may be arranged in a diagonal direction on a parallel line having a spacing distance D. Thus, in the case where the first mounting part 115 and the second mounting part 117 may be arranged in a diagonal direction, the spacing distance D between the first light emitting diode 140 and the second light emitting diode 150 can be maximized, so that heat generated from each of the first and second light emitting diodes 140, 150 can be effectively radiated. These mounting parts 115, 117 may be formed by two or more mounting parts according to the number of light emitting diodes which are being mounted, and may be arranged in various configurations in consideration of the orientation angle and heat radiation characteristic.

Meanwhile, in the light emitting device 100 according to the first embodiment exemplarily shown in FIG. 2, the first mounting part 115 and the second mounting part 117 are formed spaced apart from each other, whereas in the light emitting device 100 according to a second embodiment exemplarily shown in FIG. 3, the first mounting part 115 and the second mounting part 117 are formed without a spacing therebetween.

In the light emitting device 100 according to the first embodiment exemplarily shown in FIG. 2, the inclination surface of the first mounting part 115 is formed in the left (L) direction, and the inclination surface of the second mounting part 117 is formed in the right (R) direction. Therefore, when the light emitting diodes 140, 150 are mounted on the mounting parts 115 and 117, respectively, the direction of light emitted from the first light emitting diode 140 is inclined in the left (L) direction with respect to a center line, and the direction of light emitted from the second light emitting diode 150 is inclined in the right (R) direction with respect to the center line. Herein, as the slopes a and p of the first and second mounting parts 115 and 117 increase, the orientation angles of the lights emitted from the first and second light emitting diodes 140, 150 are directed toward the left (L) or right (R) direction from the center line. Therefore, by adjusting the slopes $\alpha$ and $\beta$ of the first and second mounting parts 115, 117, it is possible to adjust the orientation angle at a desired angle.

Meanwhile, the light emitting device 100 according to the second embodiment shown in FIG. 3 has the same constitution that the first and second mounting parts 115 and 117 are respectively formed with inclination surfaces having the corresponding slopes $\alpha$ and $\beta$, as the light emitting device according to the first embodiment shown in FIG. 2 except that there is no spacing between the first mounting part 115 and the second mounting part 117. That is, the first mounting part 115 and the second mounting part 117 may be arranged on the same line or may be arranged at positions parallel to each other but without a spacing therebetween. Thus, in the case where there is no spacing between the first and second mounting parts 115 and 117, it is possible to adjust the orientation angle of the light emitting device 100 by adjusting the tile angles $\alpha$ and $\beta$ of the first and second mounting parts 115 and 117.

Figure 4:
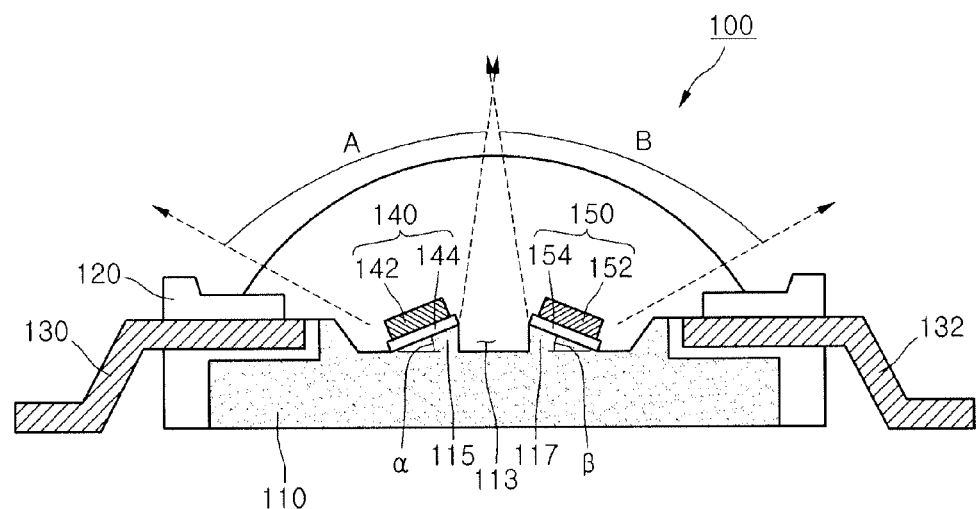
FIG. 4 is a cross-sectional view of a light emitting device according to a third embodiment.
Figure 5:
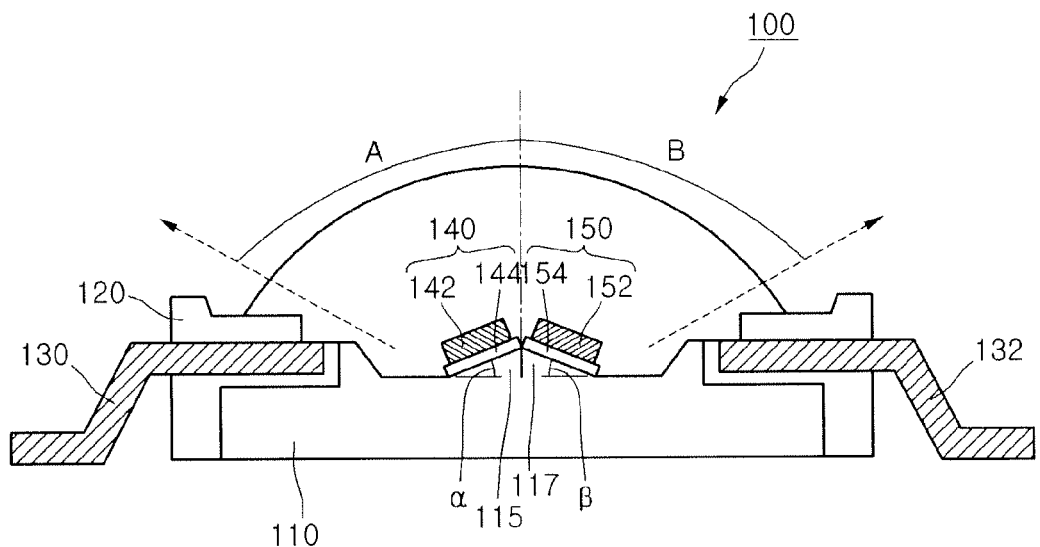
FIG. 5 is a cross-sectional view of a light emitting device according to a fourth embodiment.

FIG. 4 is a cross-sectional view of a light emitting device according to a third embodiment, and FIG. 5 is a cross-sectional view of a light emitting device according to a fourth embodiment. FIGS. 3 and 4 exemplarily show that the current embodiment is applied to a lead frame package type light emitting devices. In describing the third and fourth embodiments, the same constitutions as those in the first and second embodiments will be referred from the previous description and thus the repeated description will be omitted.

Each of light emitting devices 100 according to the third and fourth embodiments includes a body 120, a first electrode 130 and a second electrode 132 disposed inside the body 120 and electrically connected to light emitting devices 140 and 150, a heat radiation member 110 having inclination surfaces for mounting light emitting diodes 140, 150 in the cavity 113 and thermally connected to the light emitting diodes 140, 150, and a lens part 160 formed at a light emitting region of the body 120 on which the light emitting diodes 140, 150 are mounted, scattering or focusing light.

The cavity 113 may be sealed by using a transparent sealant (not shown). A fluorescent material for converting light emitted from the light emitting diodes 140, 150 to a light having a predetermined color may be added to the transparent sealant.

The lens part 160 may be disposed on the light emitting diodes 140, 150 to change the orientation angle of the light emitted from the light emitting diodes 140, 150. The lens part 160 may be disposed directly in contact with the light emitting diodes 140, 150 or apart from the light emitting diodes 140, 150, and has a shape for scattering or focusing light. For example, the lens part 160 may be formed in various shapes, such as a semispherical shape an upper surface of which is convex, or in a shape having a convex upper surface and a concave portion formed in the convex upper surface. Also, according to the directions and slopes of the inclination surfaces on which the light emitting diodes 140, 150 are mounted, the lens part 160 may be formed in a asymmetric semispherical shape in which only a region corresponding to the light emitting region is protruded or recessed. The lens part 160 may be formed of a material including a transparent resin material such as silicon or epoxy, and may include a fluorescent material at least a portion thereof.

Therefore, lights emitted from the light emitting diodes 140, 150 mounted on the mounting parts 115, 117 may be scattered or focused by the lens part 160 and then emitted.

Figure 6:
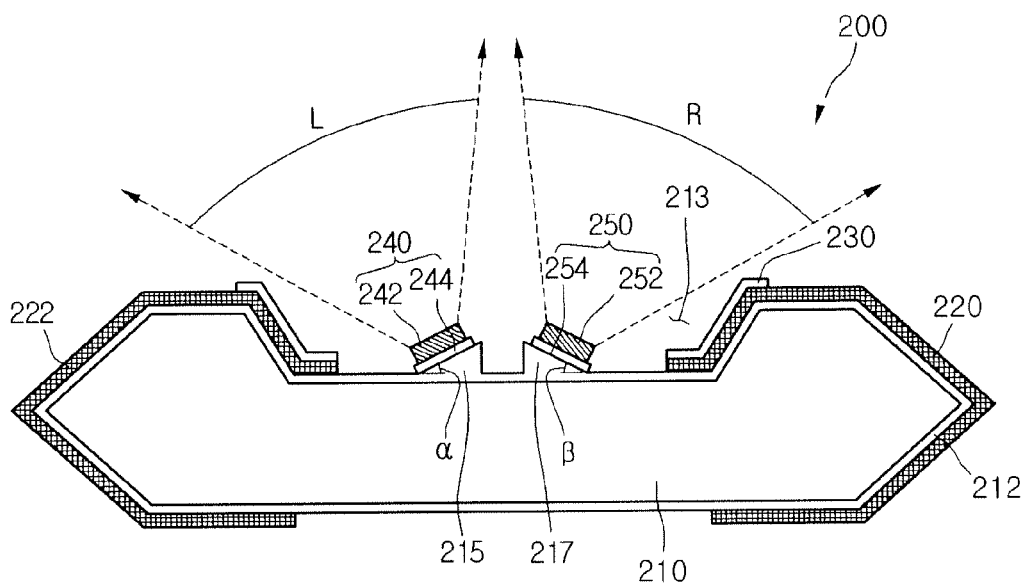
FIG. 6 is a cross-sectional view of a light emitting device according to a fifth embodiment.
Figure 7:
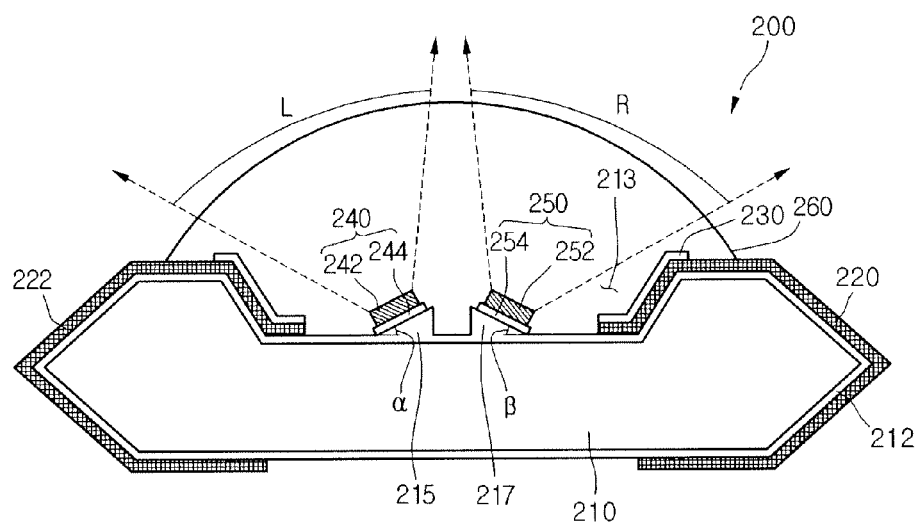
FIG. 7 is a cross-sectional view of a light emitting device according to a sixth embodiment.

FIG. 6 is a cross-sectional view of a light emitting device according to a fifth embodiment, and FIG. 7 is a cross-sectional view of a light emitting device according to a sixth embodiment. FIGS. 6 and 7 exemplarily show that the current embodiments are applied to wafer level package type light emitting devices.

As shown in FIG. 6, the light emitting device 100 according to the fifth embodiment includes a body 210 having a cavity 213, an insulating layer 212 on a surface of the body 210, first electrode 130 and second electrode 132 on the body 210, a reflective layer 230 formed on at least some region of the insulating layer, reflecting light, and mounting parts 215, 217 providing inclination surfaces for mounting light emitting diodes 240, 250. The cavity 213 in which the light emitting diodes 240, 250 are mounted may be sealed by using a sealant (not shown).

The cavity 213 in which the light emitting devices 240, 250 are mounted may be formed at an upper portion of the body 210. The body 210 may be formed of various materials such as silicon (Si), aluminum (Al), aluminum nitride (AlN), aluminum oxide ($AlO_x$), photo sensitive glass (PSG), sapphire ($Al_2O_3$), beryllium oxide (BeO), or the like.

The cavity 213 may be formed in a concave container shape, such as a cup shape, a polygonal shape, an elliptical shape, a circular shape, etc. Herein, a circumferential surface of the cavity 213 may be formed vertically or with a predetermined slope in consideration of distribution angles of lights emitted from the mounted light emitting diodes 240, 250. The cavity 213 may be formed with various methods according to the material of the body 210. For example, when the body 210 is formed of silicon (Si), the cavity 213 may be formed by performing a wet etching.

The insulating layer 212 prevents the body 210 from being electrically shorted to the first and second electrodes 220, 222, the reflective layer 230, an external power, or the like. The insulating layer 212 may be formed of at least one of silicon oxide ($SiO_2$, $Si_xO_y$), silicon nitride ($Si_3N_4$, $Si_xN_y$), silicon oxynitride ($SiO_xN_y$), and aluminum oxide ($Al_2O_3$), preferably, silicon oxide ($SiO_2$, $Si_xO_y$), but the invention is not limited thereto. Also, in the case where the body 210 is formed of insulator such as aluminum nitride (AlN), aluminum oxide ($AlO_x$), or the like, the insulating layer 212 may not be formed.

The first electrode 220 and the second electrode 222 may be formed on the insulating layer 212 to supply power to the light emitting devices 240, 250. The first electrode 220 and the second electrode 222 may be formed separately as a positive electrode and a negative electrode, and may be formed in two or more electrodes.

The reflective layer 230 may be formed at a position capable of efficiently reflecting lights emitted from the light emitting diodes 240, 250, for example, inside the cavity 213 of the body 210, but the invention is not limited thereto. The reflective layer 230 may have a multi-layer structure, for example, a Ti/Ag structure including a titanium (Ti) layer and a silver (Ag) layer stacked sequentially.

The light emitting diodes 240 and 250 may be provided in a structure in which light emitting chips 242 and 252 are formed on dies 244 and 254, respectively. Each of the light emitting diodes 240 and 250 may be at least one of a red light emitting diode emitting red light, a green light emitting diode emitting green light, and a blue light emitting diode emitting blue light, but the invention is not limited thereto. In this embodiment, since the light emitting diodes 240 and 250 are two or more, it is also possible to apply the light emitting diodes 240, 250 each emitting a different color light.

Mounting parts 215 and 217 for mounting the light emitting diodes 240 and 250 are formed on the insulating layer 212. By mounting the light emitting diodes 240 and 250 on the mounting parts 215 and 217, respectively, the light emitting diodes 240 and 250 are fixed with a slope according to the slopes α and β of the mounting parts 215 and 217. Accordingly, the orientation angle of the light emitting device 200 varies with the mounting angle of each of the light emitting diodes 240 and 250.

The mounting parts 215, 217 may be formed by two or more mounting parts according to the number of light emitting diodes which are being mounted, and may be arranged in various configurations in consideration of the orientation angle and heat radiation characteristic. The current embodiment exemplarily shows that the first light emitting diode 240 is mounted on the inclination surface of the first mounting part 215 and the second light emitting diode 250 is mounted on the inclination surface of the second mounting part 217.

For example, the inclination surface of the first mounting part 215 may be formed in the left (L) direction, and the inclination surface of the second mounting part 217 may be formed in the right (R) direction. Therefore, when the light emitting diodes 240 and 250 are mounted on the mounting parts 215 and 217, respectively, the direction of light emitted from the first light emitting diode 240 is inclined in the left (L) direction with respect to a center line, and the direction of light emitted from the second light emitting diode 250 is inclined in the right (R) direction with respect to the center line. Herein, as the slopes α and β of the mounting parts 215 and 217 increase, the orientation angles of the lights emitted from the first and second light emitting diodes 240 and 250 are directed toward the left (L) or right (R) direction from the center line. Therefore, by adjusting the slopes α and β of the mounting parts 215 and 217, it is possible to adjust the orientation angle at a desired angle.

FIG. 7 is a cross-sectional view of a light emitting device according to a sixth embodiment, and exemplarily shows a wafer level package type light emitting device. In describing the sixth embodiment, the same constitution as that in the third embodiment will be referred from the previous description and thus the repeated description will be omitted.

The light emitting device 200 according to the sixth embodiment includes mounting parts 215 and 217 providing inclination surfaces for mounting plural light emitting diodes 240 and 250 in a cavity of a body 210, and a lens part 260 formed at a light emitting region of the cavity 213 in which the light emitting diodes 240 and 250 are mounted, scattering or focusing light.

The cavity 213 may be sealed by using a transparent sealant (not shown). A fluorescent material for converting light emitted from the light emitting diodes 240 and 250 to a light having a predetermined color may be added to the transparent sealant.

The lens part 260 may be disposed on the light emitting diodes 240 and 250 to change the orientation angles of lights emitted from the light emitting diodes 240 and 250. The lens part 260 may be disposed directly in contact with the light emitting diodes 240 and 250 or apart from the light emitting diodes 240 and 250, and has a shape for scattering or focusing light. For example, the lens part 260 may be formed in various shapes, such as a semispherical shape an upper surface of which is convex, or in a shape having a convex upper surface and a concave portion formed in the convex upper surface. Also, according to the directions and slopes of the inclination surfaces on which the light emitting diodes 240 and 250 are mounted, the lens part 260 may be also formed in a asymmetric semispherical shape in which only a region corresponding to the light emitting region is protruded or recessed. The lens part 260 may be formed of a material including a transparent resin material such as silicon or epoxy, and may include a fluorescent material at least a portion thereof.

The light emitting device 200 according to the sixth embodiment exemplarily shows that the inclination surface of the first mounting part 215 is formed in the left (L) direction and the inclination surface of the second mounting part 217 is formed in the right (R) direction. Therefore, when the light emitting diodes 240 and 250 are mounted on the mounting parts 215 and 217, respectively, the direction of light emitted from the first light emitting diode 240 is inclined in the left (L) direction with respect to a center line, and the direction of light emitted from the second light emitting diode 250 is inclined in the right (R) direction with respect to the center line.

The lights emitted from the light emitting diodes 240 and 250 mounted on the mounting parts 215 and 217 may be scattered or focused by the lens part 260 and then emitted. Therefore, by modifying the shape of the lens part 260, it is possible to enhance the orientation angle and light emitting characteristics of the light emitting device 200.

Figure 8:
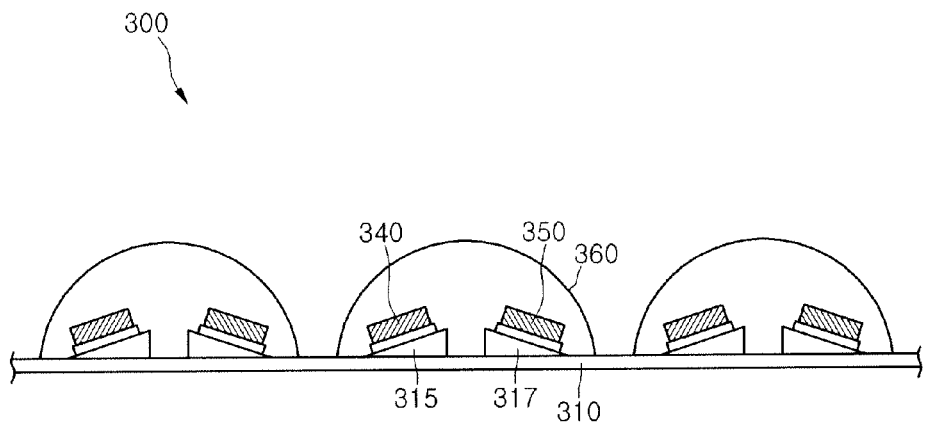
FIG. 8 is a cross-sectional view of a light emitting device according to a seventh embodiment.
Figure 9:
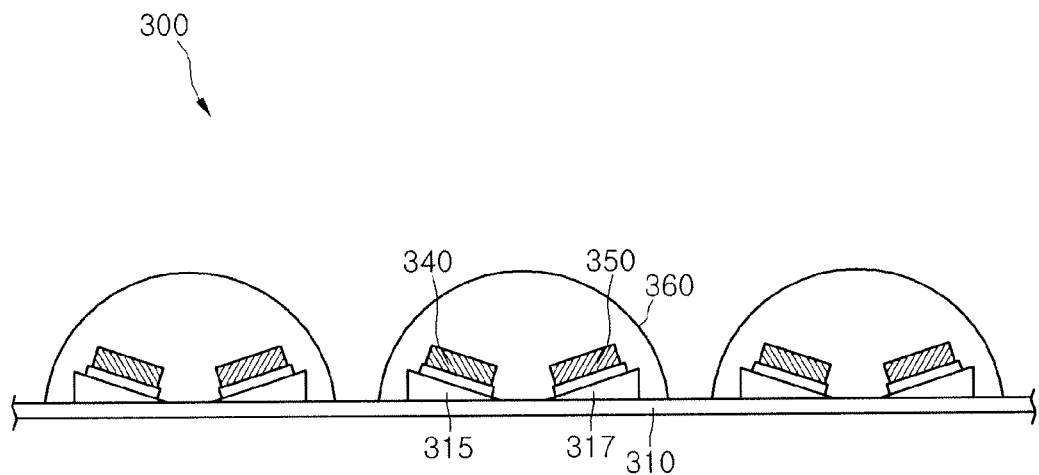
FIG. 9 is a cross-sectional view of a light emitting device according to an eighth embodiment.

FIG. 8 is a cross-sectional view of a light emitting device 300 according to a seventh embodiment, and FIG. 9 is a cross-sectional view of a light emitting device 300 according to an eighth embodiment. FIGS. 8 and 9 exemplarily show that the current embodiments are applied to chip on board (COB) type light emitting devices in which light emitting diodes 340 and 350 are mounted in a chip shape on a substrate 310.

As shown in FIGS. 8 and 9, the light emitting device 300 includes the substrate 310, a plurality of mounting parts 315 and 317 providing inclination surfaces for mounting the plurality of light emitting diodes 340 and 350, and a resin part 360 sealing the light emitting diodes 340 and 350, and the light emitting diodes 340 and 350 may be electrically connected to the substrate 310 through a wire (not shown).

The substrate 310 may use various substrates, such as a single-layer printed circuit board (PCB), a multi-layer PCB, an FPCB, a ceramic substrate, a metal substrate, etc. A lead frame or an electrode layer for supplying power may be patterned on the substrate 310, and a reflective layer may be formed. Also, a cavity for mounting the light emitting diodes 340 and 350 may be formed.

The light emitting diodes 340 and 350 may be arranged in plurality on the substrate in a row direction and/or a column direction, and are electrically connected to the substrate 310. The light emitting diodes 340 and 350 may be fixed on the substrate 310 by using a wire bonding, a flip chip bonding, a die bonding, or the like. The light emitting diodes 340 and 350 may be at least one of a red light emitting diode emitting red light, a green light emitting diode emitting green light, and a blue light emitting diode emitting blue light, and are not limited thereto. In this embodiment, since the light emitting diodes 340 and 350 are two or more, it is also possible to apply the light emitting diodes 340 and 350 each emitting a different color light.

The mounting parts 315 and 317 may be formed on the substrate 310 and provide inclination surfaces for mounting the light emitting diodes 340 and 350. As the light emitting diodes 340 and 350 are mounted on the mounting parts 315 and 317, the light emitting diodes 340 and 350 are fixed with slopes according to slopes of the mounting parts 315 and 317. Therefore, the orientation angle of the light emitting device 300 varies with the slopes of the mounting parts 315 and 317. The mounting parts 315 and 317 may be formed by processing the substrate 310 to allow mounting regions of the substrate 310 to be protruded with inclination surfaces, or by attaching a protruded and inclined structure capable of mounting the light emitting diodes 340 and 350 on the substrate 310.

The mounting parts 315 and 317 may be formed by two or more mounting parts according to the number of light emitting diodes which are being mounted, and may be arranged in various configurations in consideration of the orientation angle and heat radiation characteristic. The current embodiment exemplarily shows that the first light emitting diode 340 is mounted on the inclination surface of the first mounting part 315 and the second light emitting diode 350 is mounted on the inclination surface of the second mounting part 317.

In the case of the light emitting device 300 according to the seventh embodiment shown in FIG. 8, the inclination surface of the first mounting part 315 may be formed in the left (L) direction, and the inclination surface of the second mounting part 317 may be formed in the right (R) direction. Therefore, when the light emitting diodes 340 and 350 are mounted on the mounting parts 315 and 317, respectively, the direction of light emitted from the first light emitting diode 340 is inclined in the left (L) direction with respect to a center line, and the direction of light emitted from the second light emitting diode 350 is inclined in the right (R) direction with respect to the center line. Herein, as the slopes α and β of the mounting parts 315 and 317 increase, the orientation angles of the lights emitted from the first and second light emitting diodes 340 and 350 are directed toward the left (L) or right (R) direction from the center line. Therefore, by adjusting the slopes α and β of the mounting parts 315 and 317, it is possible to adjust the orientation angle at a wider angle.

In the case of the light emitting device 300 according to the eighth embodiment shown in FIG. 9, an inclination surface of the first mounting part 315 and an inclination surface of the second mounting part 317 are formed facing each other. Therefore, when the light emitting diodes 340 and 350 are mounted on the mounting parts, respectively, the light emitted from the first light emitting diode 340 and the light emitted from the second light emitting diode 350 are directed toward a center line and focused. As the slopes of the mounting parts 315 and 317 increase, the lights emitted from the light emitting diodes 340 and 350 are oriented toward the center line. Therefore, by adjusting the slopes of the mounting parts 315 and 317, the orientation angle ranges can be adjusted.

Meanwhile, the light emitting diodes 340 and 350 mounted on the mounting parts 315 and 317 may be sealed by a resin part 360. The resin part 360 may be formed in a semispherical shape or a convex lens shape using a transparent resin such as epoxy, and the material and shape of the resin part 360 may be modified according to the layout of the light emitting device 300. Also, a fluorescent material changing the light emitting characteristic may be added to at least a region of the resin part 360.

As exemplarily described in the seventh embodiment and the eighth embodiment, in the COB type light emitting devices 300, the plural mounting parts 315 and 317 having a slope are formed on the substrate 310 such that the light emitting diodes 340 and 350 are mounted with a slope with respect to a horizontal surface of the light emitting device 300. Therefore, the light irradiation direction and the orientation angle can be adjusted without a large change in the structure of the light emitting device 300.

Figure 10:
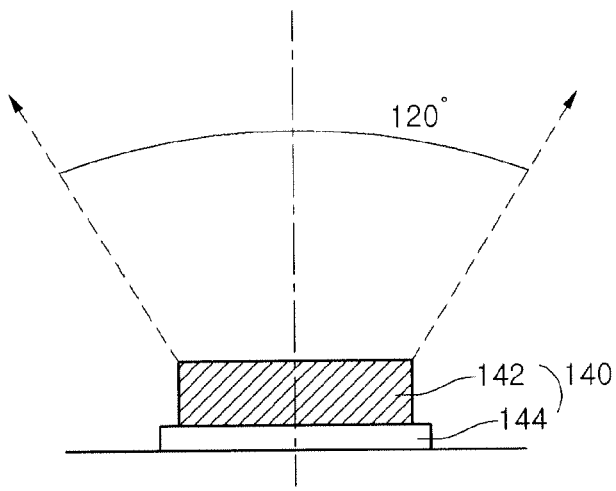
FIG. 10 is a schematic view showing irradiation state of light emitted from a light emitting diode according to a related art.
Figure 11:
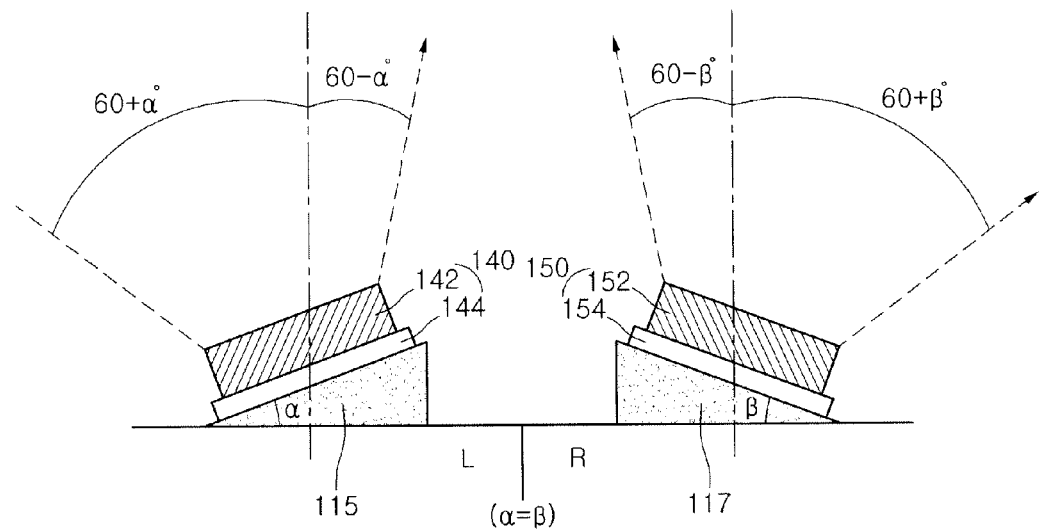
FIGS. 11 through 13 are schematic views showing irradiation states of lights emitted from light emitting diodes according to embodiments.
Figure 12:
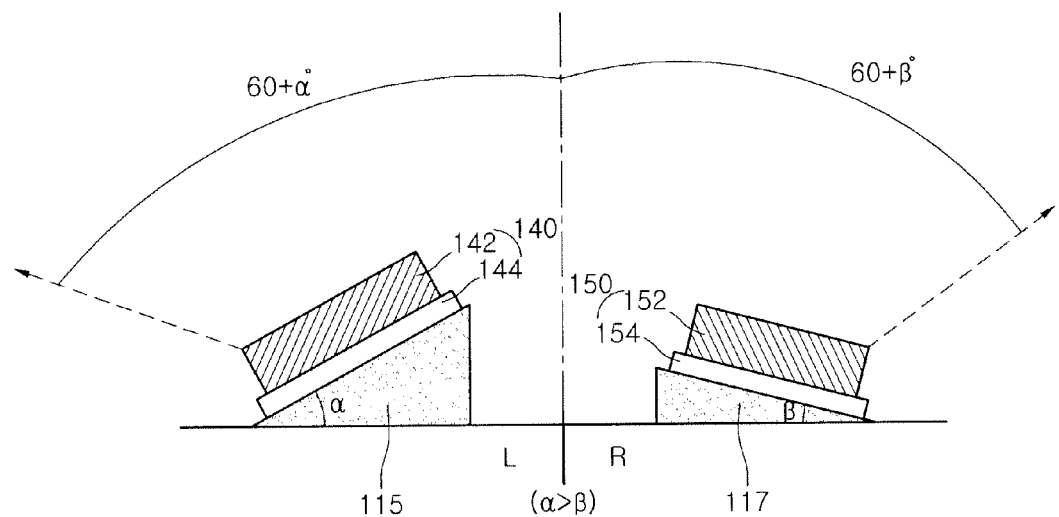
Figure 13:
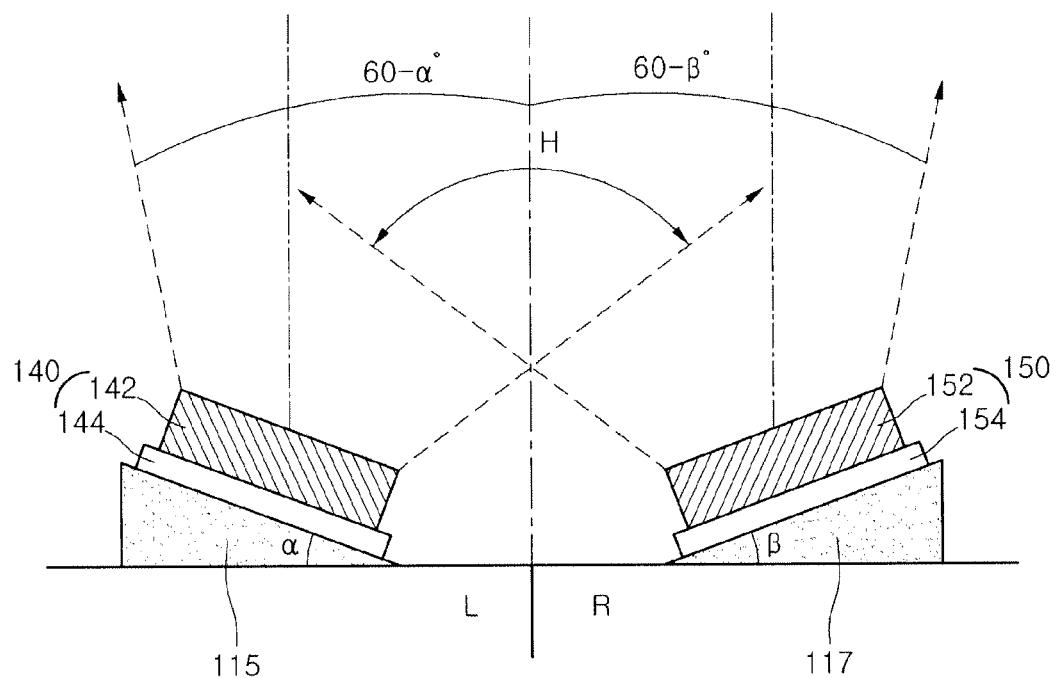

FIG. 10 is a schematic view showing irradiation state of light emitted from a light emitting diode according to a related art, and FIGS. 11 through 13 are schematic views showing irradiation states of lights emitted from light emitting diodes according to the embodiments.

As shown in FIG. 10, a light emitting diode 140 mounted in a light emitting device has an orientation angle of about 120°, and typically may have an orientation angle of about 110°-130°. Therefore, in the case where the light emitting diode 140 is mounted in a direction parallel to a horizontal surface, the irradiation direction of light is concentrated in a vertical direction and the orientation angle may be set to 110°-130°. FIG. 10 exemplarily shows that the light is irradiated at an orientation angle of 120°.

FIG. 11 is a schematic view showing irradiation state of light when two light emitting diodes 140 and 150 have inclination directions (L and R) opposite to each other and have the same slope (i.e., α=β) according to the embodiment. When the light emitting diodes 140 and 150 are mounted with slopes of α° and β° with respect to a horizontal surface, the irradiation direction of light is moved by α° and β° from a center line, respectively.

The first mounting part 115 is disposed at the left (L) and has a slope of α° in the left direction. Accordingly, the orientation angle of the first light emitting diode 140 mounted on the first mounting part 115 is inclined by α° toward the left direction (L) from the center line. For example, when the orientation angle of the first light emitting diode 140 is 120°, the orientation angle is inclined by 60°+α° toward the left direction from the center line.

The second mounting part 117 is disposed at the right (R) and has a slope of β° in the right direction. Accordingly, the orientation angle of the second light emitting diode 150 mounted on the second mounting part 117 is inclined by β° toward the right direction (R) from the center line. For example, when the orientation angle of the second light emitting diode 150 is 120°, the orientation angle is inclined by 60°+β° toward the right direction from the center line.

Therefore, in the case of the light emitting device including the first light emitting diode 140 and the second light emitting diode 150, the orientation angle may be expanded by α° in the left direction (L) and by β° in the right (R) direction.

FIG. 12 is a schematic view showing irradiation state of light when two light emitting diodes 140 and 150 have inclination directions (L and R) opposite to each other, respectively and a slope α of a first mounting part 115 is greater than a slope β of a second mounting part 117 (i.e., α>β) according to the embodiment.

The first mounting part 115 is disposed at the left (L) and an inclination surface of the first mounting part 115 has the slope of α° in the left direction. Accordingly, the orientation angle of the first light emitting diode 140 mounted on the first mounting part 115 is inclined by α° toward the left direction (L) from the center line. For example, when the orientation angle of the first light emitting diode 140 is 120°, the orientation angle is inclined by 60°+α° toward the left direction from the center line.

The second mounting part 117 is disposed at the right (R) and an inclination surface of the second mounting part 117 has the slope of β in the right direction. Accordingly, the orientation angle of the second light emitting diode 150 mounted on the second mounting part 117 is inclined by β° toward the right direction (R) from the center line. For example, when the orientation angle of the second light emitting diode 150 is 120°, the orientation angle is inclined by 60°+β° toward the right direction from the center line.

Then, since the slope α of the first mounting part 115 is set greater than the slope β of the second mounting part 117 (i.e., α>β), the orientation angle of the light emitting device including the first light emitting diode 140 and the second light emitting diode 150 is inclined toward the left direction as a whole. That is, by mounting two light emitting diodes 140 and 150 on the mounting parts 115 and 117 having different slopes, the orientation angle of the light emitting device can be adjusted in a desired direction.

FIG. 13 is a schematic view showing irradiation state of light when two light emitting diodes 140 and 150 are mounted in a first mounting part 115 and a second mounting part 117, inclination surfaces of which are formed facing each other.

The first mounting part 115 is disposed at the left (L) and an inclination surface of the first mounting part 115 is formed with the slope of α° in the right (R) direction. Accordingly, the orientation angle of the first light emitting diode 140 mounted on the first mounting part 115 is inclined by α° toward the right direction (R) from the center line. Therefore, when the orientation angle of the first light emitting diode 140 is 120°, the orientation angle is inclined by 60°−α° toward the right direction from the center line.

The second mounting part 117 is disposed at the right (R) and an inclination surface of the second mounting part 117 is formed with the slope of β° in the left (L) direction. Accordingly, the orientation angle of the second light emitting diode 150 mounted on the second mounting part 117 is inclined by β° toward the left direction (L) from the center line. Therefore, when the orientation angle of the second light emitting diode 150 is 120°, the orientation angle is inclined by 60°−β° toward the left direction from the center line.

Accordingly, in the case of the light emitting device including the first light emitting diode 140 and the second light emitting diode 150, the orientation angle may be reduced by α° in the left direction (L) and by β° in the right (R) direction.

As described above, the embodiments can expand or reduce the orientation angle of the light emitting devices and adjust the orientation angle at a desired direction by adjusting the inclination directions and slopes of the mounting parts 115 and 117 on which the light emitting diodes 140 and 150 are mounted.

Figure 14:
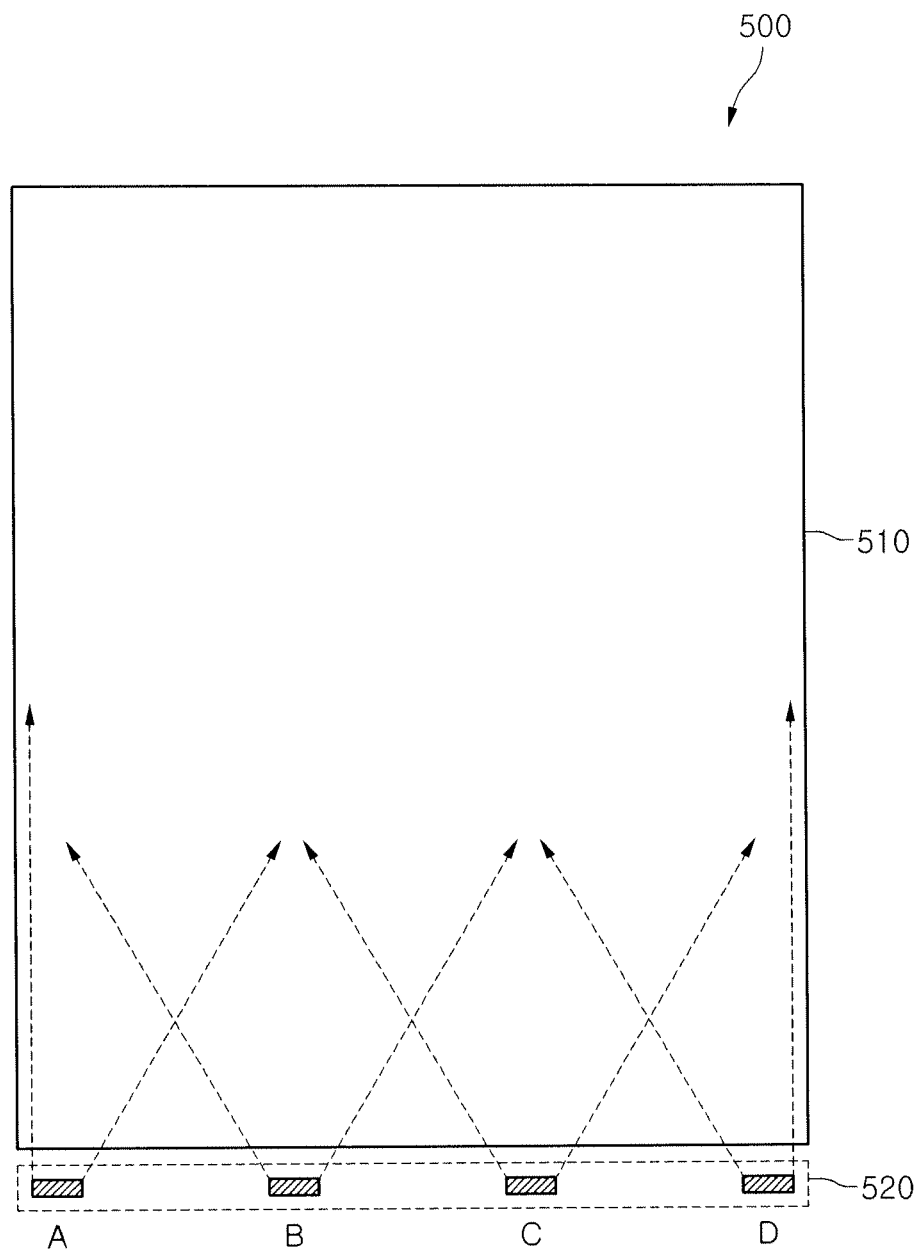
FIG. 14 is a schematic view of a light unit according to a first embodiment.

FIG. 14 is a schematic view of a light unit 500 according to a first embodiment, and exemplarily shows an edge type backlight unit.

As shown in FIG. 14, the light unit 500 includes a light guide panel 510 guiding light, and a light source 520 supplying the light guide panel 510 with light and including at least one or more light emitting devices having different orientation angles.

The light guide panel 510 reflects, refracts and scatters lights emitted from the light emitting devices arranged at one side and converts the light to a plane light through a front surface thereof. The light guide panel 510 may be formed of a material, such as polycarbonate-series resin (PC), polymethylmethacrylate-series resin (PMMA), methacrylate-styrene copolymer (MS), or the like.

The light source 520 includes a plurality of light emitting devices A, B, C, D, and is arranged at a side surface of the light guide panel 510 to provide light to the light guide panel 510. The respective light emitting devices A, B, C, D have orientation angles that are different from one another according to the arrangement position thereof. The light emitting devices may have different orientation angles by mounting two or more light emitting diodes constituting each of the light emitting devices with a slope with respect to a mounted surface thereof.

Among the light emitting devices A, B, C, D, the light emitting devices B and C positioned at a central portion of an edge of the light guide panel 510 may transfer light toward the light guide panel 510 without adjusting the orientation angles.

On the other hand, the light emitting devices A and D positioned at both sides of the edge of the light guide panel 510 have the orientation angles set in a center direction of the light guide panel 510 so as to prevent the light from being leaked to an outside of the light guide panel 510.

Herein, packages of the respective light emitting devices A, B, C, D are mounted on the same plane, but light emitting diodes in each of the light emitting devices emit lights having different orientation angles according to slopes of surfaces on which the light emitting diodes are mounted. Accordingly, the orientation angles of the respective light emitting devices A, B, C, D can be adjusted without changing a design factor of the light emitting devices A, B, C, D.

Also, since the light emitting devices A and D supply more light toward the center portion of the light guide panel 510, the light emitting device B adjacent to the light emitting device A may be arranged with a relatively wide spacing distance. The light emitting device C adjacent to the light emitting device D may be also arranged with a relatively wide spacing distance. Therefore, it is possible to decrease the number of light emitting devices equipped in the light unit 500.

Figure 15:
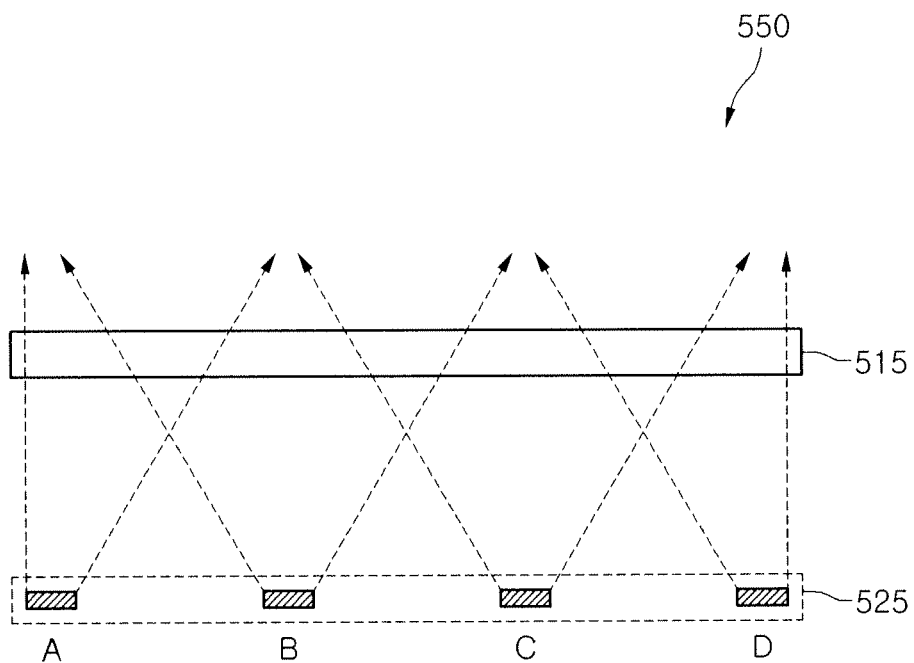
FIG. 15 is a schematic view of a light unit according to a second embodiment.

FIG. 15 is a schematic view of a light unit 550 according to a second embodiment and exemplarily shows a direct type backlight unit.

As shown in FIG. 15, the light unit 550 includes a light diffusion plate 515 diffusing light, and a light source 525 supplying the light diffusion plate 515 with light and including at least one or more light emitting devices having different orientation angles.

The light diffusion plate 515 may supply light generated from the light source 525 to a display panel (not shown) disposed above the light diffusion plate 515. The diffusion plate 515 may be used to guarantee uniform luminance and chromaticity. The light diffusion plate 515 is disposed apart by a predetermined spacing from the light source 525, and may selectively include optical sheets, such as a diffusion sheet, a prism sheet, a brightness enhancement film, a protection sheet, etc.

The light source 525 includes a plurality of light emitting devices A, B, C, D, and is arranged at a side surface of the light diffusion plate 515 to provide light to the light diffusion plate 515. The respective light emitting devices A, B, C, D have orientation angles that are different from one another according to the arrangement position thereof.

Among the light emitting devices A, B, C, D, the light emitting devices B and C arranged at a central region of the light diffusion plate 515 can enhance light efficiency of the light unit 550 by adjusting the orientation angles at wider angles.

The light emitting devices A and D arranged at an edge of the light diffusion plate 515 have the orientation angles set in a center direction of the light diffusion plate 515 so as to prevent the light from being leaked to an outside of the light diffusion plate 515.

Herein, packages of the respective light emitting devices A, B, C, D are mounted on the same plane, but light emitting diodes in each of the light emitting devices emit lights having different orientation angles according to slopes of surfaces on which the light emitting diodes are mounted. Accordingly, the orientation angles of the respective light emitting devices A, B, C, D can be adjusted without changing a design factor of the light emitting devices A, B, C, D.

Also, in the case where the orientation angles of the light emitting devices A and D are set to wide angles, the light emitting device B adjacent to the light emitting device A may be arranged with a relatively wide spacing distance, and the light emitting device C adjacent to the light emitting device D may be also arranged with a relatively wide spacing distance. Therefore, it is possible to decrease the number of light emitting devices equipped in the light unit 550.

As described above, in the light units 500 and 550 according to the embodiments, the light emitting devices having orientation angles different according to the position of the light emitting devices are arranged, thereby capable of preventing light from being leaked to an outside of the light guide panel 510 or an outside of the light diffusion plate 515, and thus enhancing the light efficiency.

Figure 16:
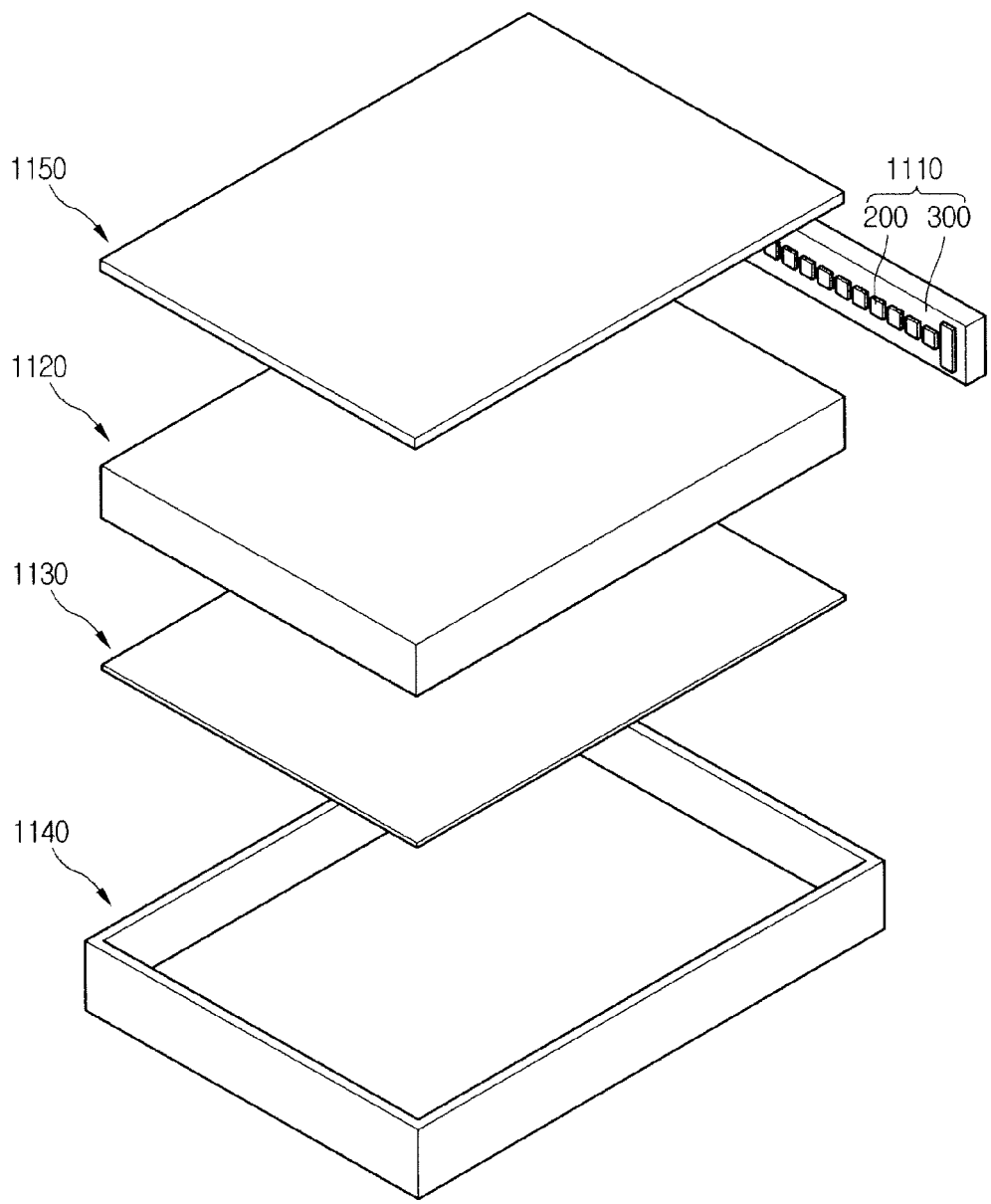
FIG. 16 is a disassembled perspective view of a backlight unit including a light emitting device or a light emitting device package according to an embodiment.

FIG. 16 is a disassembled perspective view of a backlight unit using a light emitting device package according to an embodiment. The backlight unit 1100 shown in FIG. 16 is an example of lighting systems, and the invention is not limited thereto.

Referring to FIG. 16, the backlight unit 1100 may include a bottom frame 1140, a light guide member 1120 disposed in the bottom frame 1140, and a light emitting module 1110 disposed at least one side surface of the light guide member 1120 or below the light guide member 1120. Also, a reflective sheet 1130 may be disposed below the light guide member 1120.

The bottom frame 1140 may be formed in a box shape a top surface of which is opened such that the light guide member 1120, the light emitting module 1110 and the reflective sheet 1130 can be received. The bottom frame 1140 may be formed of a metal or resin material, but the invention is not limited thereto.

The light emitting module 1110 may include a substrate and a plurality of light emitting device packages mounted on the substrate according to the embodiments. The plurality of light emitting device packages may provide light to the light guide member 1120.

As shown in FIG. 16, the light emitting module 1110 may be disposed at least one of inner side surfaces of the bottom frame 1140, and thus may provide light to at least one of the side surfaces of the light guide member 1120.

It is also to be understood that the light emitting module 1110 may be disposed below the bottom frame 1140 to provide light toward a bottom surface of the light guide member 1120. However, since such a constitution may be modified according to the design of the backlight unit 1100, the invention is not limited thereto.

The light guide member 1120 may be disposed inside the bottom frame 1140. The light guide member 1120 may convert the light provided from the light emitting module to a plane light source and guide the converted plane light source to a display panel (not shown).

The light guide member 1120 may be, for example, a light guide panel (LGP). The LGP may be formed of, for example, one of acryl-series resin such as polymethyl metacrylate (PMMA), polyethylene terephthlate (PET), poly carbonate (PC), COC, and polyethylene naphthalate resin.

An optical sheet 1150 may be disposed above the light guide member 1120.

The optical sheet 1150 may include, for example, at least one of a diffusion sheet, a prism sheet, a brightness enhancement sheet and a fluorescent sheet. For example, the optical sheet 1150 may be configured by the diffusion sheet, the prism sheet, the brightness enhancement sheet and the fluorescent sheet stacked. In this case, the diffusion sheet 1150 diffuses the light emitted from the light emitting module 1110 uniformly, and the diffused light may be focused on the display panel (not shown) by the prism sheet. At this time, the light emitted from the prism sheet is a randomly polarized light, and the brightness enhancement sheet may increase the polarization of the light emitted from the prism sheet. The prism sheet may be, for example, a vertical and/or horizontal sheet. Also, the brightness enhancement sheet may be, for example, a brightness enhancement film. Also, the fluorescent sheet may be a transparent plate or film including a fluorescent material.

The reflective sheet 1130 may be disposed below the light guide member 1120. The reflective sheet 1130 may reflect light emitted from the bottom surface of the light guide member 1120 toward a light emitting surface of the light guide member 1120.

The reflective sheet 1130 may be formed of, for example, resin material having good reflectivity, for example, PET, PC, PVC resins, or the like, but the invention is not limited thereto.

Figure 17:
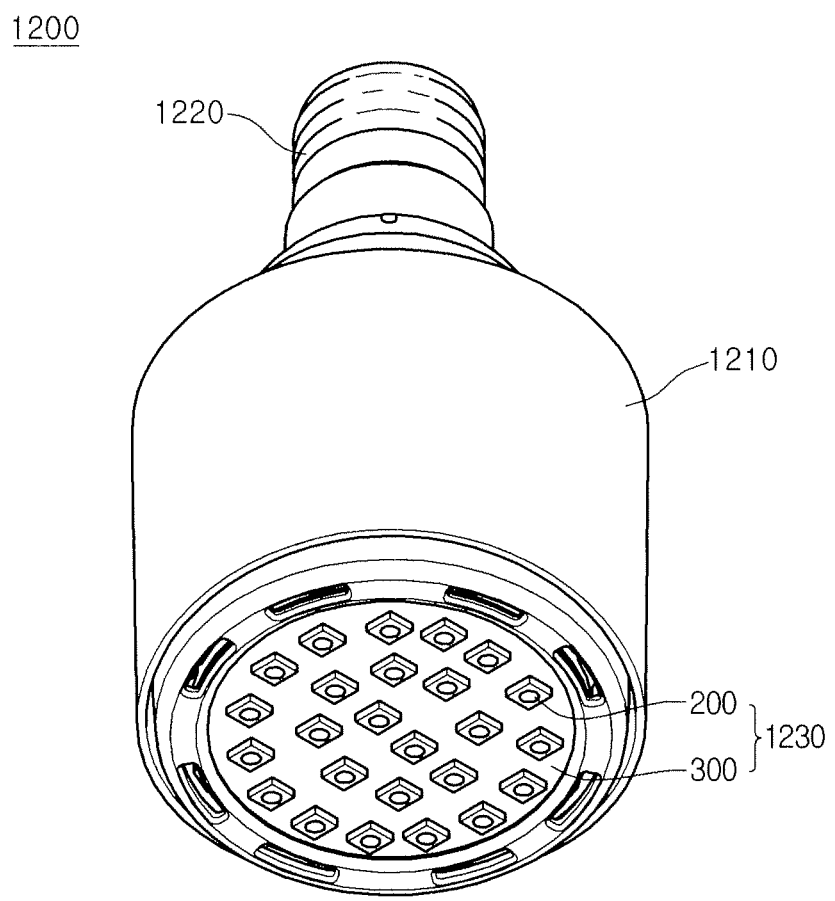
FIG. 17 is a perspective view of a lighting unit using a light emitting device package according to an embodiment.

FIG. 17 is a perspective view of a light unit using a light emitting device package according to an embodiment. The lighting unit 1200 of FIG. 17 is an example of lighting systems and the invention is not limited thereto.

Referring to FIG. 17, the lighting unit 1200 may include a case body 1210, a light emitting module 1230 installed in the case body 1210, and a connection terminal installed in the case body 1210, receiving power from an external power source.

The case body 1210 may be preferably formed of a material having good heat shielding characteristic, for example, a metal material or a resin material.

The light emitting module 1230 may include a substrate 300, and a light emitting device package 200 mounted on the substrate 300 according to at least one of the embodiments.

The substrate 300 may be an insulator substrate on which a circuit pattern is printed, and may include, for example, a general printed circuit board (PCB), a metal core PCB, a flexible PCB, a ceramic PCB, etc.

Also, the substrate 300 may be formed of a material to efficiently reflect light, and a surface thereof may be formed in a color capable of efficiently reflecting light, for example, white color, or silver color.

The light emitting device packages according to at least one of the embodiments may be mounted on the substrate 300. Each of the light emitting device packages 200 may include at least one light emitting diode (LED). The light emitting diode may include a color LED emitting red, green, blue or white light, and a UV LED emitting ultraviolet (UV).

The light emitting module 1230 may have a combination of several LEDs so as to obtain desired color and luminance. For example, the light emitting module 130 may have a combination of a white LED, a red LED, and a green LED so as to obtain a high color rendering index (CRI). A fluorescent sheet may be further disposed on a path of light emitted from the light emitting module 1230. The fluorescent sheet converts the wavelength of the light emitted from the light emitting module. For example, when the light emitted from the light emitting module 1230 has a blue wavelength band, the fluorescent sheet may include a yellow fluorescent material, so that the light, which is emitted from the light emitting module 1230 and passes through the fluorescent sheet, finally appears as white light.

The connection terminal 1220 may be electrically connected to the light emitting module 1230 to supply power to the light emitting module 1230. As shown in FIG. 17, the connection terminal 1220 may be screwed and coupled to an external power, but the invention is not limited thereto. For example, the connection terminal 1220 may be made in a pin type and inserted into an external power, or may be connected to the external power through a power line.

As described above, the lighting system may include at least one of a light guide member, a diffusion sheet, a prism sheet, a brightness enhancement sheet and a fluorescent sheet on a traveling path of light to obtain a desired optical effect.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a lead frame package including, a body, a cavity, and an opening in the cavity to emit light;
a heat radiation member in the body comprising:
a flat bottom surface coplanar with a bottom surface of the body,
a top surface parallel with the bottom surface,
a mounting part on the top surface, and
a protrusion part between the mounting part and a side edge of the heat radiation member wherein the protrusion part includes a first surface meeting the top surface and a side surface perpendicular to the top surface in a region where the protrusion part meets the body, wherein the mounting part comprises a second inclined surface having a slope relative to the top surface;
a light emitting diode on the second inclined surface; and
an electrode electrically connected to the light emitting diode,
wherein the side surface of the protrusion part directly contacts the body,
wherein the mounting part and the heat radiation member are formed of a single seamless body, and
wherein the electrode is parallel to the top surface of the heat radiation member.

2. The light emitting device of claim 1, wherein the heat radiation member is thermally connected to the light emitting diode.

3. The light emitting device of claim 2, wherein the heat radiation member is formed within and exposed through an opening in the body.

4. The light emitting device of claim 3, wherein the opening in the body, through which, the heat radiation member is exposed, is opposite the top surface.

5. The light emitting device of claim 2, wherein the mounting part and the heat radiation member are formed from a metal or resin material.

6. The light emitting device of claim 5, wherein the mounting part and the heat radiation member are formed of a same material.

7. The light emitting device of claim 1, wherein the mounting part are separated for maximizing heat dissipation.

8. The light emitting device of claim 1, wherein the second inclined surface of the mounting part has the slope greater than 0° and equal to or less than 30° with respect to the top surface.

9. The light emitting device of claim 1, wherein the light emitting diode has an orientation angle that depends upon the slope of the second inclined surface on which it is mounted.

10. The light emitting device of claim 1 further comprising:
a lens on the light emitting diode.

11. A light emitting device comprising:
a body of a semiconductor comprising a cavity and an opening in the cavity;
an insulating layer directly on the body, wherein the body comprises a flat top surface, a first inclined surface in a peripheral region of the top surface, wherein the first inclined surface meets an end of the top surface;
a mounting part on the insulating layer, wherein the mounting part comprises a second inclined surface having a slope relative to the top surface;
a light emitting diode on the second inclined surface; and
an electrode directly on the insulating layer and electrically connected to the light emitting diode,
wherein the insulating layer wholly covers the body, and
wherein the mounting part and the insulating layer are formed of a single seamless body.

12. The light emitting device of claim 11, wherein the mounting part and the insulating layer are formed of silicon oxide.

13. The light emitting device of claim 1, wherein each of the first inclined surface and the second inclined surface meets the top surface.

14. The light emitting device of claim 11, wherein the second inclined surface has the slope greater than 0° and equal to or less than 30° with respect to the substantially horizontal surface.

15. The light emitting device of claim 11, wherein an orientation of the light emitting diode depends on the slope of the second inclined surface.

16. The light emitting device of claim 11 further comprising:
a lens on the light emitting diode.

17. The light emitting device of claim 11, wherein the second inclined surface meets the top surface.

18. The light emitting device of claim 11, further comprising a reflective layer disposed on the insulating layer corresponding to the first inclined surface.

19. A light unit comprising:
a light guide panel; and
a light emitting device providing light to the light guide panel, wherein the light emitting device comprises:
a lead frame package including, a body, a cavity, and an opening in the cavity to emit light;
a heat radiation member in the body comprising:
a bottom surface coplanar with a bottom surface of the body,
a top surface parallel with the bottom surface,
a mounting part on the top surface, and a protrusion part between the mounting part and a side edge of the heat radiation member wherein the protrusion part includes a first surface meeting the top surface and a side surface perpendicular to the top surface in a region where the protrusion part meets the body, wherein the mounting part comprises a second inclined surface having a slope relative to the top surface;
a light emitting diode on the second inclined surface; and
an electrode electrically connected to the light emitting diode,
wherein the side surface of the protrusion part is directly in contact with the body,
wherein the mounting part and the heat radiation member are formed of a single seamless body, and
wherein the electrode is parallel to the top surface of the heat radiation member.

20. The light unit of claim 19 further comprising:
a plurality of light emitting devices, wherein at least one of the plurality of light emitting devices is positioned at a side edge of the light guide panel and at least one of the plurality of light emitting devices is positioned towards the center of the light guide panel, relative to the at least one light emitting device positioned at the side edge,
wherein the second inclined surface on which the at least one light emitting device positioned towards the center of the light guide panel causes light produced by the corresponding at least one light emitting diode to be dispersed into the light guide panel at a first orientation angle, wherein the second inclined surface associated with the at least one light emitting device positioned at the side edge of the light guide panel causes light produced by the corresponding at least one light emitting diode to be dispersed into the light guide panel at a second orientation angle, and wherein the first orientation angle is different than the second orientation angle.

21. The light unit of claim 20, wherein the second inclined surface associated with the at least one light emitting device positioned at the side edge of the light guide panel is configured to direct light produced by the corresponding light emitting diode mounted thereon away from the side edge of the light guide panel, thereby reducing a leakage of light from the light guide panel.

22. A light unit comprising:
a light guide panel; and
at least one light emitting device providing light to the light guide panel, wherein the at least one light emitting device comprises:
  a body of a semiconductor comprising a cavity and an opening in the cavity;
  an insulating layer directly on the body, wherein the body comprises a flat top surface and a first inclined surface in a peripheral region of the top surface; wherein the first inclined surface meets an end of the top surface;
  a mounting part on the insulating layer, wherein the mounting part comprises a second inclined surface meeting the top surface;
  a light emitting diode on the second inclined surface; and
  an electrode directly on the insulating layer and electrically connected to the light emitting diode,
  wherein the insulating layer wholly covers the body, and
  wherein the mounting part and the insulating layer are formed of a single seamless body.

23. The light unit of claim 22 further comprising:
a plurality of light emitting devices,
wherein at least one of the plurality of light emitting devices is positioned at a side edge of the light guide panel and at least one of the plurality of light emitting devices is positioned towards the center of the light guide panel, relative to the at least one light emitting device positioned at the side edge,
wherein the second inclined surface associated with the at least one light emitting device positioned towards the center of the light guide panel causes light produced by the corresponding light emitting diode to be dispersed into the light guide panel at a first orientation angle,
wherein the second inclined surface associated with the at least one light emitting device positioned at the side edge of the light guide panel causes light produced by the corresponding light emitting diode to be dispersed into the light guide panel at a second orientation angle, and
wherein the second orientation angle is different than the first orientation angle.

24. The light unit of claim 23, wherein the second inclined surface associated with the at least one light emitting device positioned at the side edge of the light guide panel is configured to direct light produced by the corresponding light emitting diode mounted thereon to be directed away from the side edge of the light guide panel, thereby reducing a leakage of light from the light guide panel.

25. The light unit of claim 22 further comprising:
a reflective layer disposed on the insulating layer corresponding to the first inclined surface.

26. The light unit of claim 19, wherein each of the first inclined surface and the second inclined surface meets the top surface.

27. The light unit of claim 22, wherein the second inclined surface meets the top surface.

* * * * *

UNITED STATES PATENT AND TRADEMARK OFFICE
CERTIFICATE OF CORRECTION

PATENT NO. : 9,111,777 B2
APPLICATION NO. : 12/882853
DATED : August 18, 2015
INVENTOR(S) : Kee Youn Jang et al.

It is certified that error appears in the above-identified patent and that said Letters Patent is hereby corrected as shown below:

Title Page at item (73)
Insert --LG INNOTEK CO., LTD.--
Delete "LG ELECTRONICS INC."

Signed and Sealed this
Tenth Day of May, 2016

Michelle K. Lee
*Director of the United States Patent and Trademark Office*